(12) United States Patent
Wood

(10) Patent No.: US 7,500,043 B2
(45) Date of Patent: Mar. 3, 2009

(54) ARRAY OF DATA PROCESSING ELEMENTS WITH VARIABLE PRECISION INTERCONNECT

(75) Inventor: Paul B. Wood, Austin, TX (US)

(73) Assignee: Altrix Logic, Inc., Austin, TX (US)

( * ) Notice: Subject to any disclaimer, the term of this patent is extended or adjusted under 35 U.S.C. 154(b) by 0 days.

(21) Appl. No.: 11/379,666

(22) Filed: Apr. 21, 2006

(65) Prior Publication Data
US 2006/0259529 A1    Nov. 16, 2006

Related U.S. Application Data

(60) Provisional application No. 60/673,994, filed on Apr. 22, 2005, provisional application No. 60/674,070, filed on Apr. 22, 2005, provisional application No. 60/673,995, filed on Apr. 22, 2005.

(51) Int. Cl.
*G06F 13/14* (2006.01)
*G06F 13/36* (2006.01)
*G06F 13/40* (2006.01)
*G06F 1/12* (2006.01)
*H04J 15/00* (2006.01)
*H04J 3/06* (2006.01)

(52) U.S. Cl. ............... 710/307; 710/100.3; 713/400; 370/464; 370/503; 708/232

(58) Field of Classification Search ......... 710/305–307, 710/100, 3, 100.3; 709/251, 253; 712/16–18, 712/32, 33; 713/400; 370/464, 503; 708/232; 375/355
See application file for complete search history.

(56) References Cited

U.S. PATENT DOCUMENTS

| | | | | |
|---|---|---|---|---|
| 4,858,177 A | * | 8/1989 | Smith | 712/16 |
| 5,113,523 A | * | 5/1992 | Colley et al. | 712/12 |
| 5,274,832 A | | 12/1993 | Khan | |

(Continued)

OTHER PUBLICATIONS

"Developing micropipeline wavefront arbiters" by G. Gopalakrishnan (abstract only) Publication Date: Winter 1994.*

(Continued)

*Primary Examiner*—Khanh Dang
*Assistant Examiner*—Christopher A Daley
(74) *Attorney, Agent, or Firm*—Law Offices of Mark L. Berrier

(57) ABSTRACT

Systems and methods for processing data using an array of data processing elements that are coupled together with a variable precision interconnect. One embodiment comprises data processing elements coupled by variable precision interconnects to form a row-column array. The interconnects and/or data processing elements may be synchronous or asynchronous. The data processing elements may operate in a fixed manner, or they may be programmable, and selectable data processing elements in the array may be bypassed. The interconnects and data processing elements may be configured to handle data in a digit-serial manner, with tags for each digit identifying whether the digit is the first and/or last digit in a data word. The data processing elements may be coupled to a system bus that enables communication of data between the data processing elements and external devices and allows control information to be communicated to and from the data processing elements.

30 Claims, 9 Drawing Sheets

U.S. PATENT DOCUMENTS

| | | | | |
|---|---|---|---|---|
| 5,410,723 | A | * | 4/1995 | Schmidt et al. ............... 712/18 |
| 5,504,918 | A | * | 4/1996 | Collette et al. ............... 712/29 |
| 5,710,910 | A | * | 1/1998 | Kehl et al. .................. 713/400 |
| 6,175,717 | B1 | * | 1/2001 | Rebec et al. .................. 725/63 |
| 6,260,087 | B1 | * | 7/2001 | Chang ....................... 710/100 |
| 6,832,185 | B1 | * | 12/2004 | Musselman et al. ........... 703/23 |
| 7,006,531 | B2 | * | 2/2006 | Samrao ..................... 370/470 |
| 2002/0122425 | A1 | * | 9/2002 | Gullicksen ............... 370/395.1 |
| 2004/0054870 | A1 | | 3/2004 | Kirsch | |
| 2004/0246503 | A1 | | 12/2004 | Silverbrook | |

OTHER PUBLICATIONS

Andrew Royal and Peter Y.K. Cheung, Globally Asynchronous Locally Synchronous FPGA Architectures, 2003.*

Daewook Kim, Manho Kim and Gerald Sobelman, Asynchronous FIFO Interfaces for GALS on-Chip Switched Networks.*

Kung, Ling-Pei, "Obtaining Performance and Programmability Using Reconfigurable Hardware for Media Processing", Feb. 2002, Ph.D. thesis, MIT.

* cited by examiner

ARRAY OF DATA PROCESSING ELEMENTS WITH VARIABLE PRECISION INTERCONNECT

CROSS-REFERENCE TO RELATED APPLICATIONS

This application claims the benefit of U.S. Provisional Patent Application 60/673,994, filed Apr. 22, 2005, U.S. Provisional Patent Application 60/674,070, filed Apr. 22, 2005, and U.S. Provisional Patent Application 60/673,995, filed Apr. 22, 2005. All of the foregoing patent applications are incorporated by reference as if set forth herein in their entirety.

BACKGROUND

1. Field of the Invention

The invention relates generally to electronic logic circuits, and more particularly to systems and methods for processing data using an array of data processing elements that are coupled together using a variable precision interconnect.

2. Related Art

As computer technologies have advanced, the amount of processing power and the speed of computer systems has increased. The speed with which software programs can be executed by these systems has therefore also increased. Despite these increases, however, there has been a continuing desire to make software programs execute faster.

The need for speed is sometimes addressed by hardware acceleration. Conventional processors re-use the same hardware for each instruction of a sequential program. Frequently, programs contain critical code in which the same or similar sections of software are executed many times relative to most other sections in an application. To accelerate a program, additional hardware is added to provide hardware parallelism for the critical code fragments of the program. This gives the effect of simultaneous execution of all of the instructions in the critical code fragment, depending on the availability of data. In addition, it may be possible to unroll iterative loops so that separate iterations are performed at the same time, further accelerating the software.

While there is a speed advantage to be gained, it is not free. Hardware must be designed specifically for the software application in question. The implementation of a function in hardware generally takes a great deal more effort and resources than implementing it in software. Initially, the hardware architecture to implement the algorithm must be chosen based on criteria such as the operations performed and their complexity, the input and output data format and throughput, storage requirements, power requirements, cost or area restrictions, and other assorted criteria.

A simulation environment is then set up to provide verification of the implementation based on simulations of the hardware and comparisons with the software. A hardware target library is chosen based on the overall system requirements. The ultimate target may be an application specific integrated circuit (ASIC), a field programmable gate array (FPGA), or other similar hardware platform. The hardware design then commences using a hardware description language (HDL), the target library, and the simulation environment. Logic synthesis is performed on the HDL design to generate a netlist that represents the hardware based on the target library.

While there are number of complex and expensive design tools employed throughout the process, frequent iterations are typically needed in order to manage tradeoffs, such as between timing, area, power and functionality. The difficulty of the hardware design process is a function of the design objectives and the target library. The continued advances in semiconductor technology continue to raise the significance of device parameters with each new process generation. That, coupled with the greater design densities that are made possible, ensures that the hardware design process will continue to grow in complexity over time.

This invention pertains to the implementation of algorithms in hardware—hardware that performs logic or arithmetic operations on data. Currently available methodologies range from using single processors, arrays of processors, either fixed (gate array) or field-programmable gate arrays (FPGA), or standard cell (ASIC) or full custom design techniques. Some designs may combine elements of more than one methodology. For example, a processor may incorporate a block of field programmable logic.

When comparing different implementations of programmable logic, the notion of granularity is sometimes used. It relates to the smallest programmable design unit for a given methodology. The granularity may range from transistors, through gates and more complex blocks, to entire processors. Another consideration in comparing programmable hardware architectures is the interconnect arrangement of the programmable elements. They may range from simple bit-oriented point-to-point arrangements, to more complex shared buses of various topologies, crossbars, and even more exotic schemes.

Full custom or standard cell designs with gate-level granularity and dense interconnects offer excellent performance, area, and power tradeoff capability. Libraries used are generally gate and register level. Design times can be significant due to the design flow imposed by the diversity of complex tools required. Verification after layout for functionality and timing are frequently large components of the design schedule. In addition to expensive design tools, manufacturing tooling costs are very high and climbing with each new process generation, making this approach only economical for either very high margin or very high volume designs. Algorithms implemented using full custom or standard cell techniques are fixed (to the extent anticipated during the initial design) and may not be altered.

The design methodology for fixed or conventional gate arrays is similar to that of standard cells. The primary advantages of conventional gate arrays are time-to-market and lower unit cost, since individual designs are based on a common platform or base wafer. Flexibility and circuit density may be reduced compared to that of a custom or standard cell design since only uncommitted gates and routing channels are utilized. Like those built with custom or standard cell techniques, algorithms implemented using conventional gate arrays are fixed and may not be altered after fabrication.

FPGAs, like conventional gate arrays, are based on a standard design, but are programmable. In this case, the standard design is a completed chip or device rather than subsystem modules and blocks of uncommitted gates. The programmability increases the area of the device considerably, resulting in an expensive solution for some applications. In addition, the programmable interconnect can limit the throughput and performance due to the added impedance and associated propagation delays. FPGAs have complex macro blocks as design elements rather than simple gates and registers. Due to inefficiencies in the programmable logic blocks, the interconnect network, and associated buffers, power consumption can be a problem. Algorithms implemented using FPGAs may be altered and are therefore considered programmable. Due to the interconnect fabric, they may only be configured when inactive (without the clock running). The time needed to reprogram all of the necessary interconnects and logic blocks can be significant relative to the speed of the device, making real-time dynamic programming unfeasible.

Along the continuum of hardware solutions for implementing algorithms lie various degrees of difficulty or specialization. This continuum is like an inverted triangle, in that the lowest levels require the highest degree of specialization and hence represent a very small base of potential designers, while the higher levels utilize more generally known skills and the pool of potential designers grows significantly (see Table 1.) Also, it should be noted that lower levels of this ordering represent lower levels of design abstraction, with levels of complexity rising in higher levels.

TABLE 1

Designer bases of different technologies

```
   Processor        Programmers
   FGPA             System designers
   ASIC             Hardware designers
   Custom           Circuit designers
```

There is therefore a need for a technology to provide software acceleration that offers the speed and flexibility of an ASIC, with the ease of use and accessibility of a processor, thus enabling a large design and application base.

SUMMARY OF THE INVENTION

This disclosure is directed to systems and methods for processing data using an array of data processing elements that are coupled together with a variable precision interconnect that solve one or more of the problems discussed above. One particular embodiment comprises an array of processing elements with a simple element-to-element interconnect that is fixed in width, yet supports data with variable precision. The elements receive input data over these links, and send the results of operations over them as well. The operations performed by each element may be fixed, or variable/programmable. Data passes between the elements only when the sender has new data available and the receiver needs new data. In addition, asynchronous elements may be employed to minimize power and improve performance.

An alternative embodiment comprises a plurality of data processing elements coupled by one or more interconnects to form an array, such as an array of rows and columns. One or more of the interconnects are configured to convey variable precision data between the data processing elements. The interconnects may be synchronous or asynchronous. Similarly, the data processing elements may be synchronous (locally or globally) or asynchronous. The data processing elements may operate in a fixed manner, or they may be programmable, and selectable data processing elements in the array may be bypassed. The interconnects and data processing elements may be configured to handle data in a digit-serial manner, where tags associated with each digit identify whether the digit is the first and/or last digit in a data word. In one embodiment, the array of elements is coupled to a system bus that enables communication of data between the data processing elements and external devices (e.g., external memory) and allows control information to be communicated to and from the data processing elements.

Numerous other embodiments are also possible.

BRIEF DESCRIPTION OF THE DRAWINGS

Other objects and advantages of the invention may become apparent upon reading the following detailed description and upon reference to the accompanying drawings.

Figure 1:
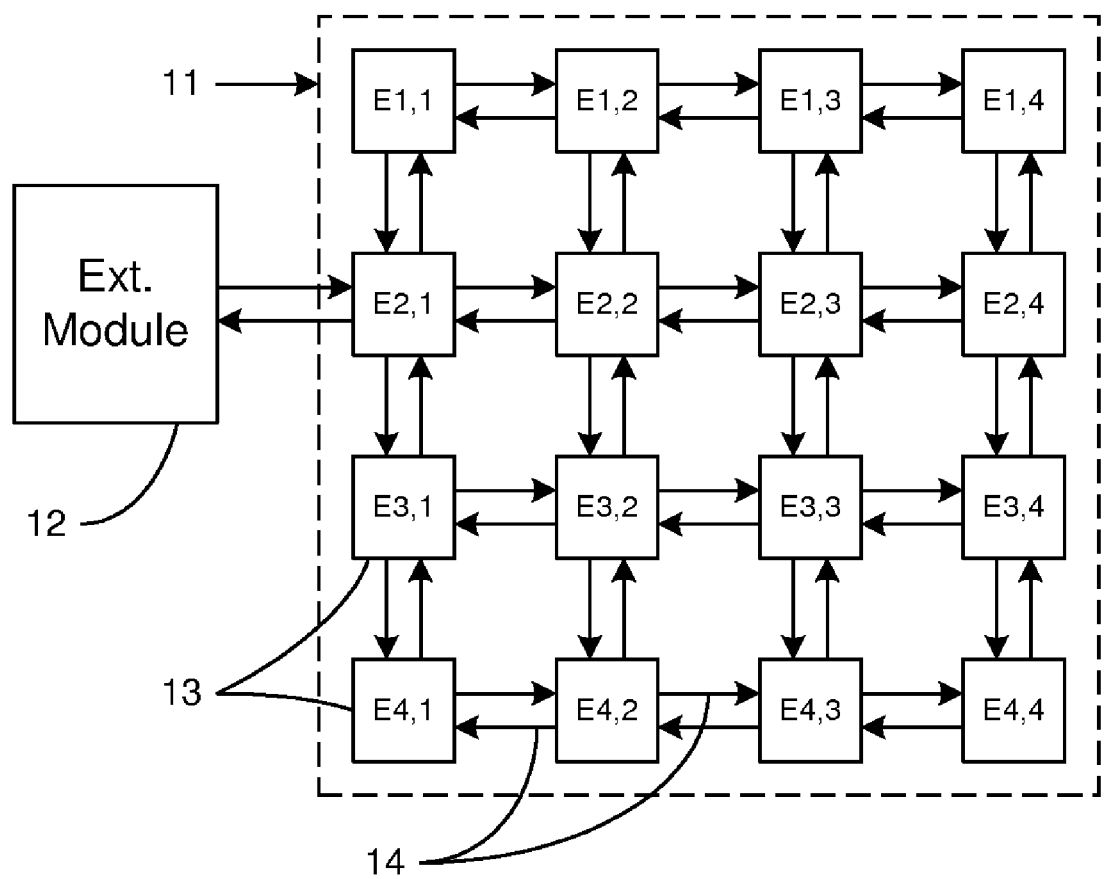
FIG. 1 is a diagram illustrating an array of processing elements that communicate with one another via a variable precision interconnect bus in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for processing data using an array of data processing elements that are coupled together with a variable precision interconnect. One embodiment comprises an array of processing elements with a simple element-to-element interconnect that is fixed in width, yet supports data with variable precision. The elements receive input data over these links, and send the results of operations over them as well. The operations performed by each element may be fixed, or variable/programmable. Data passes between the elements only when the sender has new data available and the receiver needs new data. In addition, asynchronous elements may be employed to minimize power and improve performance.

In one embodiment, the variable precision interconnect is designed to convey digit-serial data, where each digit is accompanied by flags indicating whether the digit is the first and/or last digit in the data word being transmitted. The digits are received by one of the processing elements, which performs a corresponding operation on the data word and provides its output to one or more of the other processing elements. The processing elements may be configured to operate on the data or bypass the data to other processing elements. A system bus enables the communication of data to/from the processing elements, input of command information to the processing elements and output of status information from the processing elements. The interconnect between the processing elements, as well as the processing elements themselves, may operate either synchronously or asynchronously. In one embodiment, the operation of the processing elements may be locally synchronous, but globally asynchronous.

FIG. 1 shows an array 11 of processing elements 13 that communicate with one another via a variable precision interconnect bus 14. The processing elements perform operations on data as it moves through the array from element to element. The processing elements are connected via a constant width interconnect bus or communication channel. Many interconnect topologies are possible, but in the preferred embodiment, a nearest-neighbor element-to-element arrangement has been chosen for speed and simplicity. Each element-to-element bus 14 acts as a unidirectional communications channel with a single source and destination. There are separate interconnects for input and outputs, and there are separate input and output connections in each direction (up, down, right and left in the figure) to connect neighboring elements. Processing elements 13 along the periphery of the array 11 may have their inputs tied off and outputs ignored (which are not shown in the figure), or they may be optionally connected to an external module 12, such as a memory controller, some other peripheral. In yet another embodiment, they may be coupled to other elements on the opposite side of the array. For instance, the top element in a column may be connected to the bottom element in the column, or the leftmost element in a row may be connected to the rightmost element in the row. Ideally, the interconnect bus provides a mechanism to support variable precision data.

In practice, an algorithm or computational problem is decomposed into discrete operations and mapped into a network of connected processing elements. The data is introduced into the array using any number of means, and then propagates through the array passing from element to element based on the production and consumption of data by the elements. Similarly, there are various possibilities for outputting data from the array. Processing elements may receive input data and transmit output data in various ways including (but not limited to): an external module; a system interface; and another (adjacent) element.

The system interface consists of a data bus that is common to multiple elements, in which each element may be individually selected. This allows a control unit to selectively read or write data to a selected element.

The specifics of the processing elements may vary, depending on the specific application and implementation. Elements may be optimized for certain applications with certain common operations implemented in hardware, or they may be fairly generic. At a minimum, the processing elements need to be capable of interfacing with and handling data, and need to be capable of performing the desired operations on the input data, and producing the output data. Additionally, a desirable characteristic is the ability to handle variable precision data, as in the preferred embodiment. The individual element sequence for a given operation may be fixed, or they may be completely variable, making the element programmable.

A fixed element may contain read-only-memory (ROM), a fixed programmable logic array (PLA) or some other fixed storage for controlling the sequence of events for the specified operation or function. The point at which the operations and sequence is fixed could be during the design process, or much later in the manufacturing cycle.

A variable or programmable element may contain random-access-memory (RAM), registers, non-volatile memory (such as flash memory), or some other type of alterable storage that would contain data that would control the behavior at each step in the operation sequence.

The personality of the element consists of the operation and sequence of events performed by that element. The data that defines the personality of an element may be switched or reloaded. It may also be double-buffered, such that two personalities coexist, and an external signal selects which one to use. Switching personalities may also consist of switching state, which means that any additional internal working registers or state information must be switched as well. Ideally, this information is stored for later use so that the previous context may be restored.

The personality of one or more elements could be changed after processing a given block of data, effectively changing the algorithm dynamically, or for performing more complex algorithms in a piecemeal, sequential fashion. The personality of one or more elements could be loaded at system initialization, which could be changed for field updates of products, etc. There is also a hybrid configuration in which part of the personality of the element remains relatively fixed while a second part is variable. An example of this would be a digital filter in which the input sample data is multiplied by a fixed filter coefficient. In this case, a fixed element would be set with the multiply operation, while the programmable portion would contain the variable operand. With a programmable or hybrid element, the filter coefficients may be changed within the application as parameters.

The most straightforward implementation of the element would utilize synchronous design methodologies, where a single global timing reference is used for all internal registers, as currently available commercial design tools generally enforce this approach.

Asynchronous design techniques have well known advantages in the areas of power consumption and data throughput. The design challenges of using asynchronous methods are minimized, since a single element is replicated over the entire array. Because the variable precision interface channel implements data flow principles and has closed-loop handshaking, removing the clock from the channel interface is actually a simplification. Therefore, additional implementations of the array that incorporate asynchronous variable precision channels and/or asynchronous elements are possible.

A system interface is provided so that each element within the array may be individually addressed and accessed. This may be used for initialization and diagnostic purposes, or to inject or extract data from the processing operations within the element. There is also a mechanism so that individual processing elements may signal an event by asserting an interrupt signal.

In one embodiment, the variable precision interface between elements is a digit-serial bus with status lines that indicate the current digit position within the word. Digit-serial means that the word is composed of a series of digits, which are composed of 1 or more bits. The digit size is fixed for a given implementation, however the number of digits that comprise a word may vary. A digit may occupy the first, last, or middle position of a word. Single digit words are possible, and in that case the digit is both the first and last one. A two-digit word has a first and last digit, but no middle digits. Words composed of three or more digits have one or more middle digits.

The element interconnect bus width is fixed at n digit bits, plus two flag bits and two handshake signals. The flag bits indicate whether the digit is the first and/or last digit of the data word. The two handshake signals indicate when data is ready to be transferred to and/or from processing elements. A global clock signal may optionally be utilized for synchronous implementations. By properly setting the flag bits, words that are larger than n bits may be transmitted in sequence over the interface. A single flag bit would technically be sufficient to mark the boundary condition, but this would necessitate adding a digit pipeline delay for each input so that the least-significant and most-significant positions could be individually determined.

Figure 2:
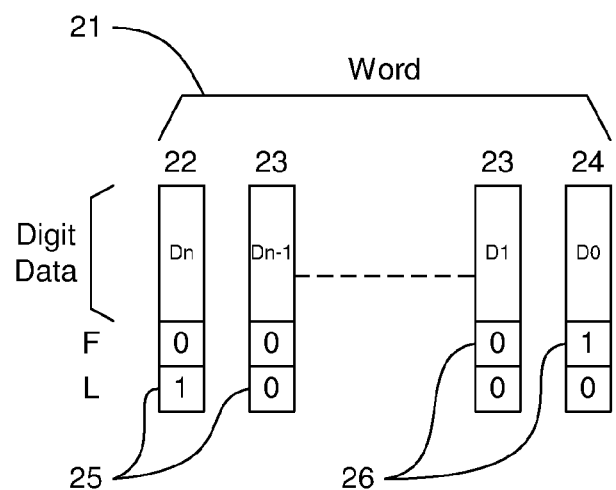
FIG. 2 is a diagram illustrating how a data word is mapped into a series of digits and flag bits to form variable precision words in accordance with one embodiment.
Figure 3:
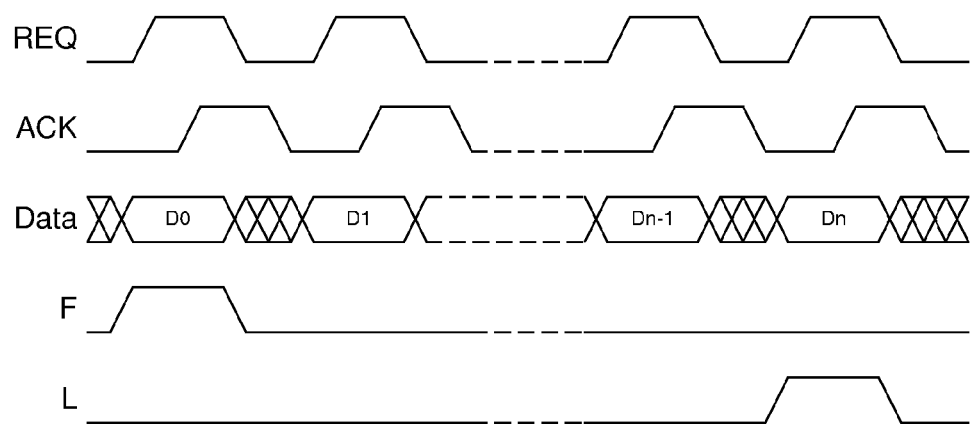
FIG. 3 is a diagram illustrating variable precision bus activity for a digit-serial data word transaction in accordance with one embodiment.

FIG. 2 shows how a word is mapped into the digits and flag bits to form variable precision words, while FIG. 3 shows variable precision bus activity for that transaction. The word 21 consists of multiple digits. Digit 0 "D0" represents the first and least significant digit, and digit n "Dn" represents the last and most significant digit of the word. The flags are designated "F" 26 for the first digit 24, and "L" 25 for the last digit 22. Digits that are not first or last are continuation digits 23. For words that only occupy one digit, both F and L flag bits will be set. Table 2 lists the combinations of flags F and L corresponding to the possible digits. The digit size may be any positive integer. In the preferred embodiment, the digit size is equal to 8 bits. Smaller or larger digit sizes may be appropriate for arrays that are targeted for applications with different throughput and area requirements.

TABLE 2

| | VP Flags | |
|---|---|---|
| F | L | Digit Type |
| 0 | 0 | Continuation digit 23 |
| 0 | 1 | Last digit 22 |
| 1 | 0 | First digit 24 |
| 1 | 1 | Single digit word |

There is no distinction between the first or last digit and digit significance. Additional bits could be added to the variable precision bus to further specify digit significance, but would be optional. Additional format bits could also be included to signify signed versus unsigned, or other formats. In the preferred embodiment, the transmission of least versus most significant digit first is handled at the algorithm level when the element operations are selected. If necessary, element functions are available that will convert between most-significant digit first and least-significant digit first formats.

The sequence of events for transmitting and receiving data over the variable precision channel of this embodiment is shown in FIG. 3. All signals shown are output from the source or transmitter element and input to the destination or receiver element, with the exception of the acknowledge handshake ACK, which is output from the destination and input to the source. The system clock is not shown in the figure. While some implementations may desire a clock signal as part of the variable precision bus, it is optional since the variable precision channel protocol is defined so that the handshaking is closed-loop, and hence a fully asynchronous interface may be implemented. This is a key point in implementations where the processing elements are asynchronous from one another.

The channel transmitter asserts the request REQ signal when a single digit of data (e.g., D0,) along with the corresponding F and L flags, is available on the bus. The data, flags, and REQ signals are held until an acknowledge ACK signal is sent by the channel receiver, indicating that the channel receiver has successfully read these signals from the bus. At that point, the REQ signal is released, while data and the flags are free to change state. The receiver continues to assert ACK until the REQ signal is released. The REQ signal is not set again until the ACK signal is inactive and new data is available for a new transaction. In this manner, a data word comprising digits D0-Dn is conveyed from the channel transmitter to the channel receiver.

The variable precision communication channels that connect adjacent processing elements also provide a mechanism for bypassing individual elements, allowing communications to jump over an element. This bypass capability makes it easier to route element connections. Any output from an element that is unused may be connected to an unused input of the same element in one of the other directions, essentially bypassing that element.

Figure 4:
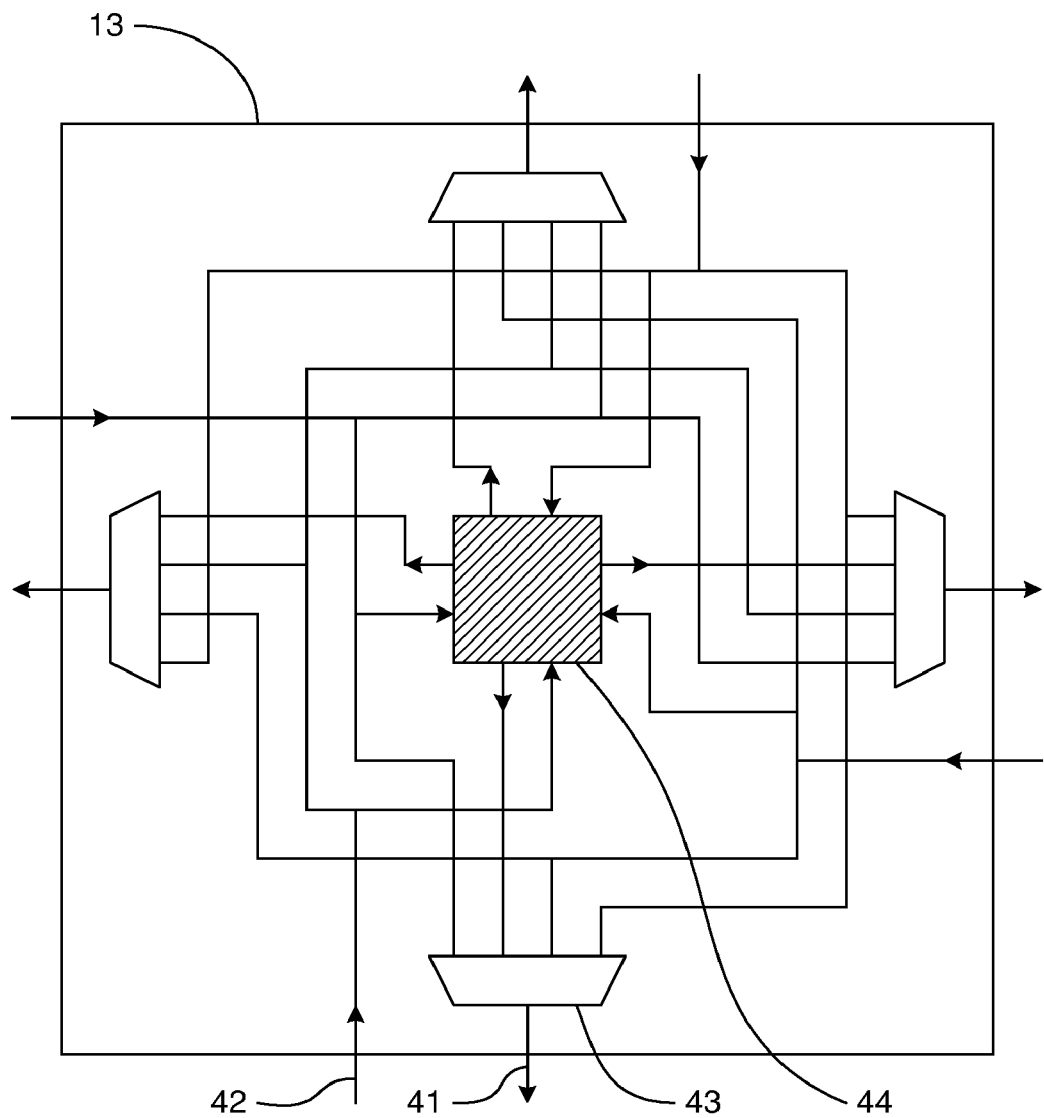
FIG. 4 is a diagram illustrating the connection of a data processing element core to enable data to be input/output in multiple directions in accordance with one embodiment.

FIG. 4 shows a diagram of an element 13 and the element core 44 along with input (e.g., 42) and output (e.g., 41) variable precision channels for each of four connection directions. The input channels are routed to the processing core and to the output selectors (e.g., 43). A bypass register within the element selects the output source to be either the element itself, or one of the other three inputs for each of the output channels of the element. Note that the output channels are shown passing through a single multiplexer 43 for simplicity, but in reality, there is the ACK return (input) signal associated with the selected channel that must be routed also. This implies an additional multiplexer for the ACK inputs—there would be a set of multiplexers for each direction.

Figure 5:
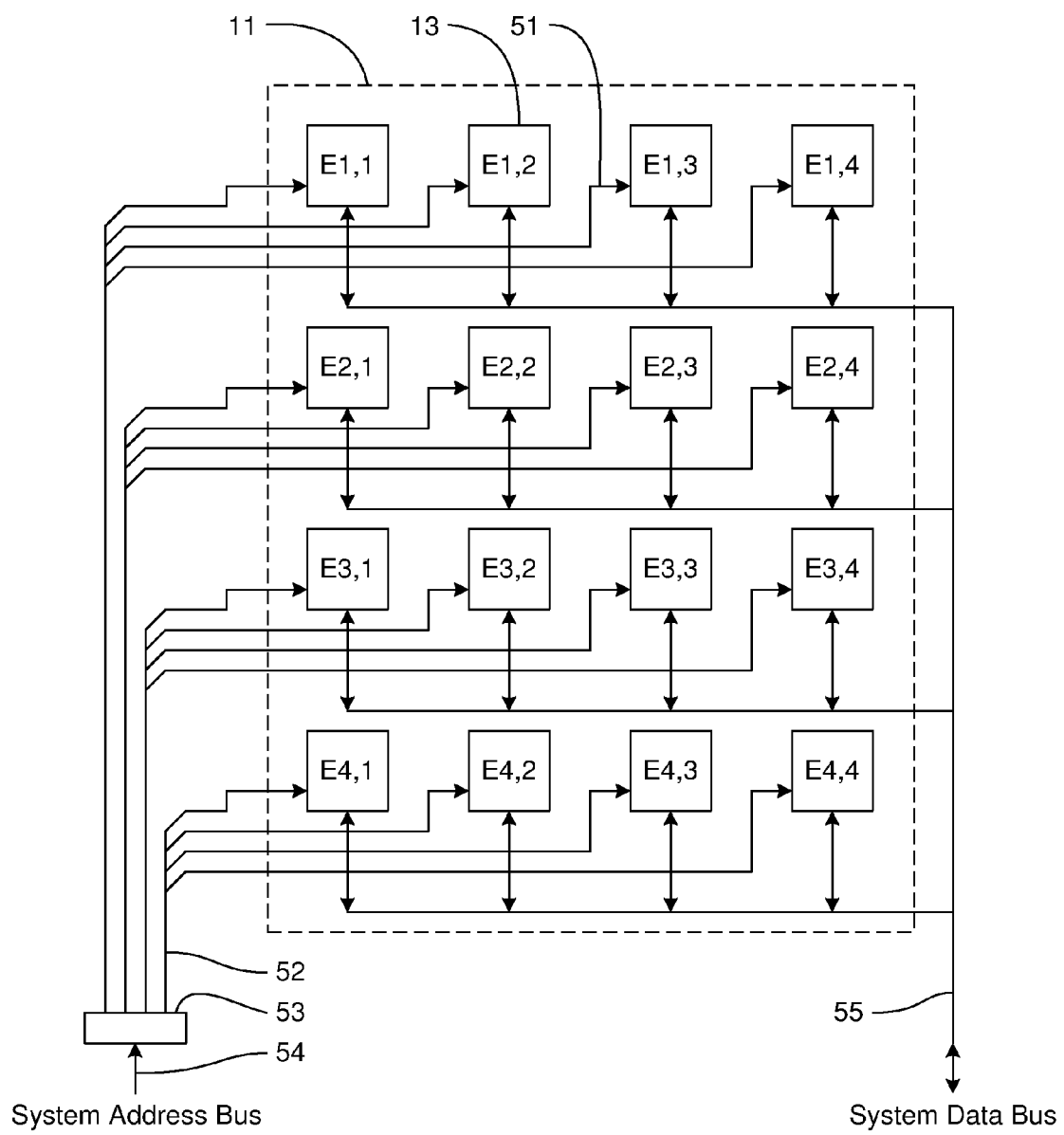
FIG. 5 is a diagram illustrating a system interface for reading and writing internal registers/memories in accordance with one embodiment.

Not shown in FIG. 1 (for clarity) is the system interface of the present embodiment, which allows each element to be selected, based on a decoded row-column address. The system interface, as shown in FIG. 5, provides a mechanism for reading and writing the internals (internal registers and memories) of each element. The system address bus 54 is used to select an individual element for each read or write operation. The address decoder 53 breaks the address down into individual select lines (e.g., 51) for each element, and a sub-address field for addressing individual element internals. The size of the sub-address is a function of the number of individual element internals that need addressed. For clarity, the group of select lines, sub-addresses, and read/write command lines for each row are shown as a single line (e.g., 52) in the drawing. The decoder may be distributed in design for larger arrays. The system data bus 55 carries the write data for the write operations, or the read data as a result of a read operation. It is shown as bidirectional, but in fact may be implemented using separate read and write busses. In addition, the read multiplexers may be distributed throughout the elements.

Collectively, the address and control signals, input data, and output data are referred to as the system bus. In addition to the read/write command lines, element select lines and sub-addresses 51, each element 13 is presented input data and provides output data on an output data bus. The input and output data buses are not necessarily variable precision, and in a preferred embodiment, a conventional 32-bits bus is used. The write control signals include byte write enable signals. The internals of the element being addressed may consist of registers or blocks of memory, or any other data structure, depending on the internals of the element. The address input to each element must be sufficient to adequately decode or resolve each addressable resource within the element. This part of the address may comprise the lower address bits of the address. The higher address bits can then be used to signify the actual element being addressed. These bits are input to decoder module 53, which that produces the individual select lines (e.g., 51)—one for each element.

In one embodiment, the system interface has a conventional, non-variable precision bus. In this embodiment, the bus is a 32-bit data bus with independent byte enables. To provide a straightforward mechanism for setting the digit position tag bits, aliases of the register or memory addresses are provided. There are four views made available. The aliases for system interface writes are shown in Table 3 and those for reads are shown in Table 4.

The digit size in the embodiment being discussed is 8-bits. For system interface write operations, the first alias allows the writing of data with word sizes of 8-bits while setting the F and L bits automatically. A second alias is provided for writing a 16-bit word while setting the flag bits, and a third one is for writing 32-bit word sizes. The fourth alias allows the writing of data while setting the F and L bits to zero, which is useful for loading words greater than 32-bits. Larger word sizes may be written by handling the endpoint byte by writing byte 0 to alias 1, followed by writes to alias 4. Finally, the ending byte needs to be written to alias 1.

TABLE 3

Write Aliases

| Alias | Byte 3 | Byte 2 | Byte 1 | Byte 0 |
|---|---|---|---|---|
| 1 | F, L, Data | F, L, Data | F, L, Data | F, L, Data |
| 2 | L, Data | F, Data | L, Data | F, Data |
| 3 | L, Data | Data | Data | F, Data |
| 4 | Data | Data | Data | Data |

The system interface read aliases provide a mechanism to read the F bits, the L bits, and the data bits separately. Alias 1 and 4 are identical and return only the data associated with the read address. Alias 2 returns the F flag in the lower bit position of each byte, while alias 3 returns the L flag in the lower bit position of each byte. Data is not returned when reading from alias 2 and 3. Those aliases are only used to determine digit alignment.

TABLE 4

Read Aliases

| Alias | Byte 3 | Byte 2 | Byte 1 | Byte 0 |
|---|---|---|---|---|
| 1 | Data | Data | Data | Data |
| 2 | F | F | F | F |
| 3 | L | L | L | L |
| 4 | Data | Data | Data | Data |

Figure 6:
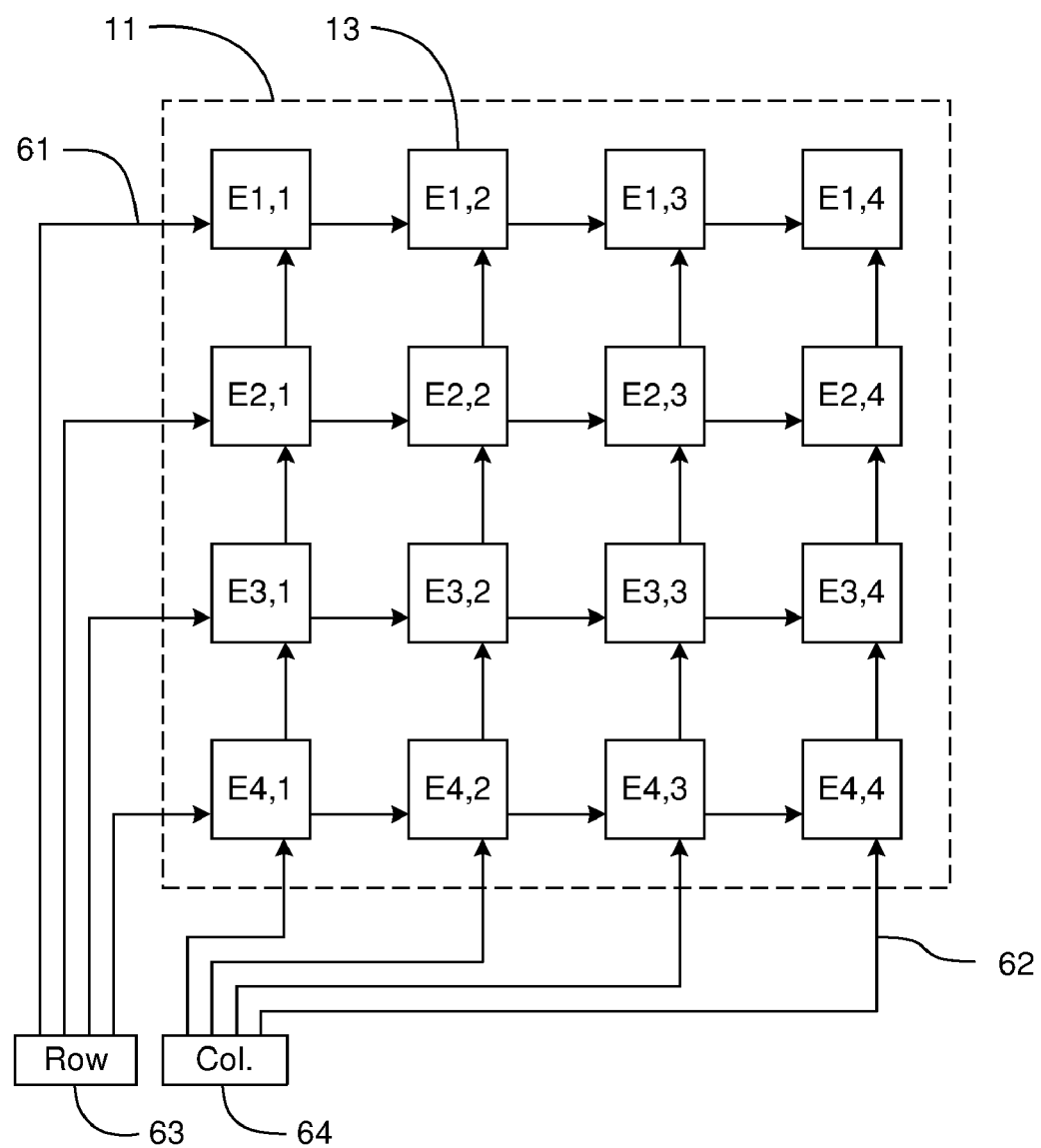
FIG. 6 is a diagram illustrating a command interface configured to provide row-column addressability to the data processing elements in the array in accordance with one embodiment.

In this embodiment, the command interface for a single command, shown in FIG. 6, provides row-column addressability in a different manner from the system interface. Instead of addressing single elements, one at a time, and providing data to them, there is a row and column address for each command. The command address register is broken into row 63 and column 64 segments. The row segment is decoded and supplies a separate row select line 61 for each row in the array. Similarly, the column segment decoding provides separate lines 62 for each column of the array. The row and column command signals are daisy-chained through the rows and columns of the element array. The first element in the column closest to the insertion point of the command receives the column command signal 62 first. It monitors the value of the signal while passing it along unmodified to the next element in the column. Each element in turn does the same until it gets to the last element in that column. Row elements are handled in the same way. The first element in the row receives the row command signal 61, passing it along to the next element in that same row, while monitoring the signal on that line. If an element observes that both the row and column signals of the same command are active, it knows that it is being instructed to perform the designated command. With addressing like the system interface, only one element at a time is accessed. With the control interface, from one to many contiguous elements within rectangular regions may be selected simultaneously.

Examples of commands that may be mapped to the command interface include reset, enable, clear interrupt, and switch state. The reset command is used to initialize an element or a group of elements. The enable command is used to selectively enable or disable groups of elements. The clear interrupt command is used to clear internal conditions within elements and is used in response to the interrupt output of the status interface. The function and context of each element may be double buffered and entire regions of the array may perform a context switch at the same time by changing the value of the state command.

Figure 7:
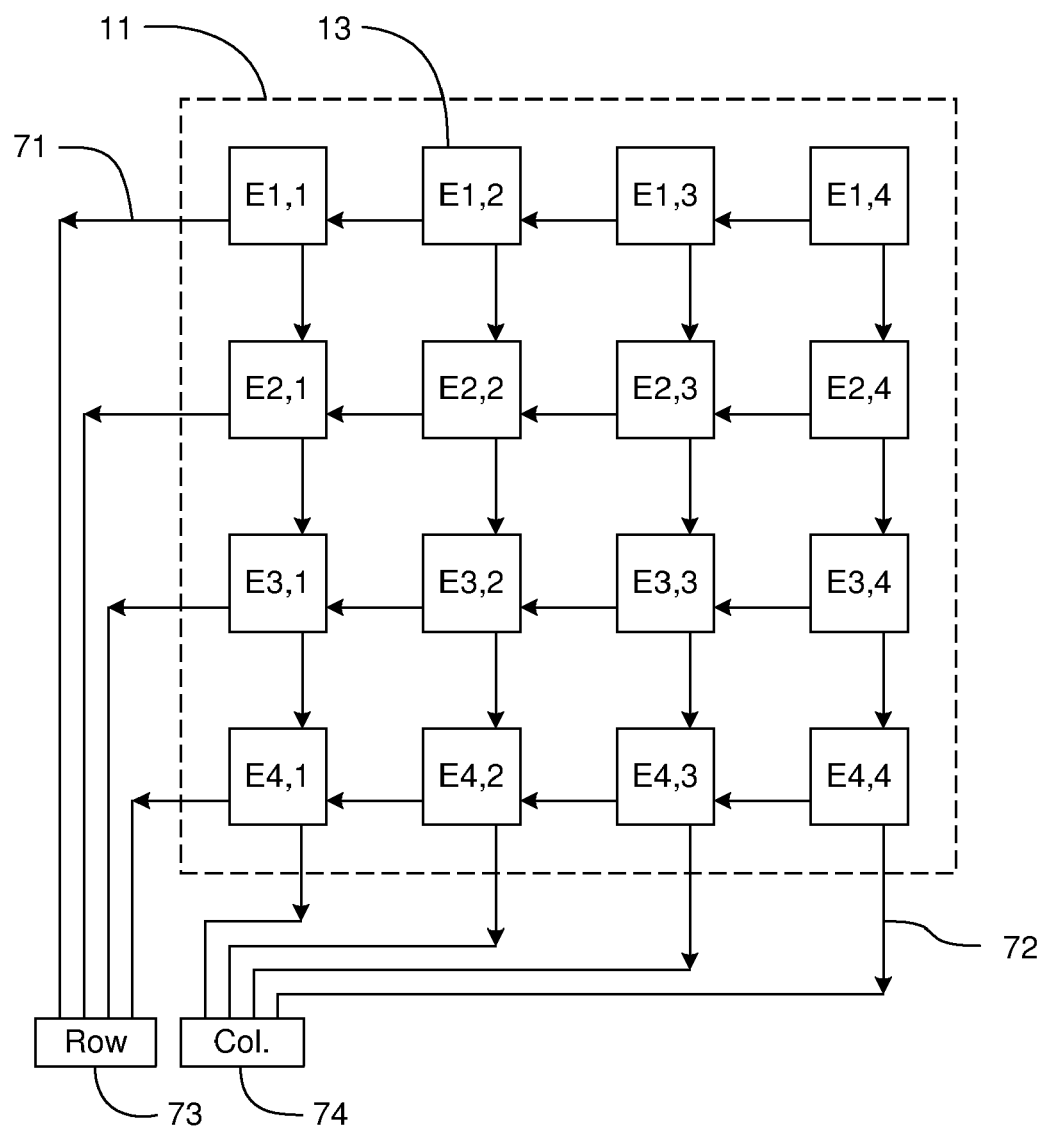
FIG. 7 is a diagram illustrating a status interface configured to enable communication of status information from the data processing elements in the array in accordance with one embodiment.

In addition to command inputs, a status output is also incorporated into a status interface in a similar fashion, as shown in FIG. 7. The interrupt status signal output is daisy chained through the row and columns that may be read in the status register, which is composed of a row component 73 and a column component 74. In the status register, there is a separate bit for each row and column of the array. Each row element takes in the output from the previous element on that row 71, modifies the status signal as necessary, and outputs it to the next element in the row. Each element in turn receives the input from the previous row element, adds its own status information, and passes it on until it reaches the status register, after the last element in the row. The column elements perform the same function, receiving an input from a previous element 72, adding any status information of their own, and passing it on to the next element in the column, or the status register 74 (if it is the last element in the column).

In sections that follow, a pseudo-code style is used to describe the microinstruction sequence of exemplary elements. The pseudo-code represents generic programming constructs, and do not necessarily imply that there is a direct correspondence to element microinstructions, though a single or combination of element microinstructions are capable of implementing the operation. Input or output pseudo-instruction operations use a variable name which is optionally a logical channel identifier. There are four input channel identifiers: a, b, c, and d. Similarly, there are four logical output channel identifiers: w, x, y, and z. Note that logical identifiers are independently mapped into physical channels corresponding to the four directions. Unlike conventional code, the pseudo-code for an element is automatically repeated. The code flow for each element restarts at the beginning when complete.

As an example of an application of this invention, consider the algorithm shown below that has been coded in the C programming language.

```
int factorial (int a) {
    int i, w, y;
    w = 1;
    for (i=1; i <= a; i++) {
        w = w * i;
    }
    y = w;
    return (y);
}
```

This code implements the factorial function and when called with an input integer "a", will return "a!" This algorithm follows the principles of single assertion that simplify the mapping process. Note that a distinction is made between assertions within a loop construct, and outside of a loop construct. Integer "a" is the input number. Integer "i" is a temporary variable that is used as a loop counter. Integer "w" is the temporary variable holding the working value of the intermediate calculation, and integer "y" is the result and return value. By definition, 0!==1, so "w" is initialized to 1 outside of the loop, even though there is an assignment to "w" inside the loop.

Figure 8:
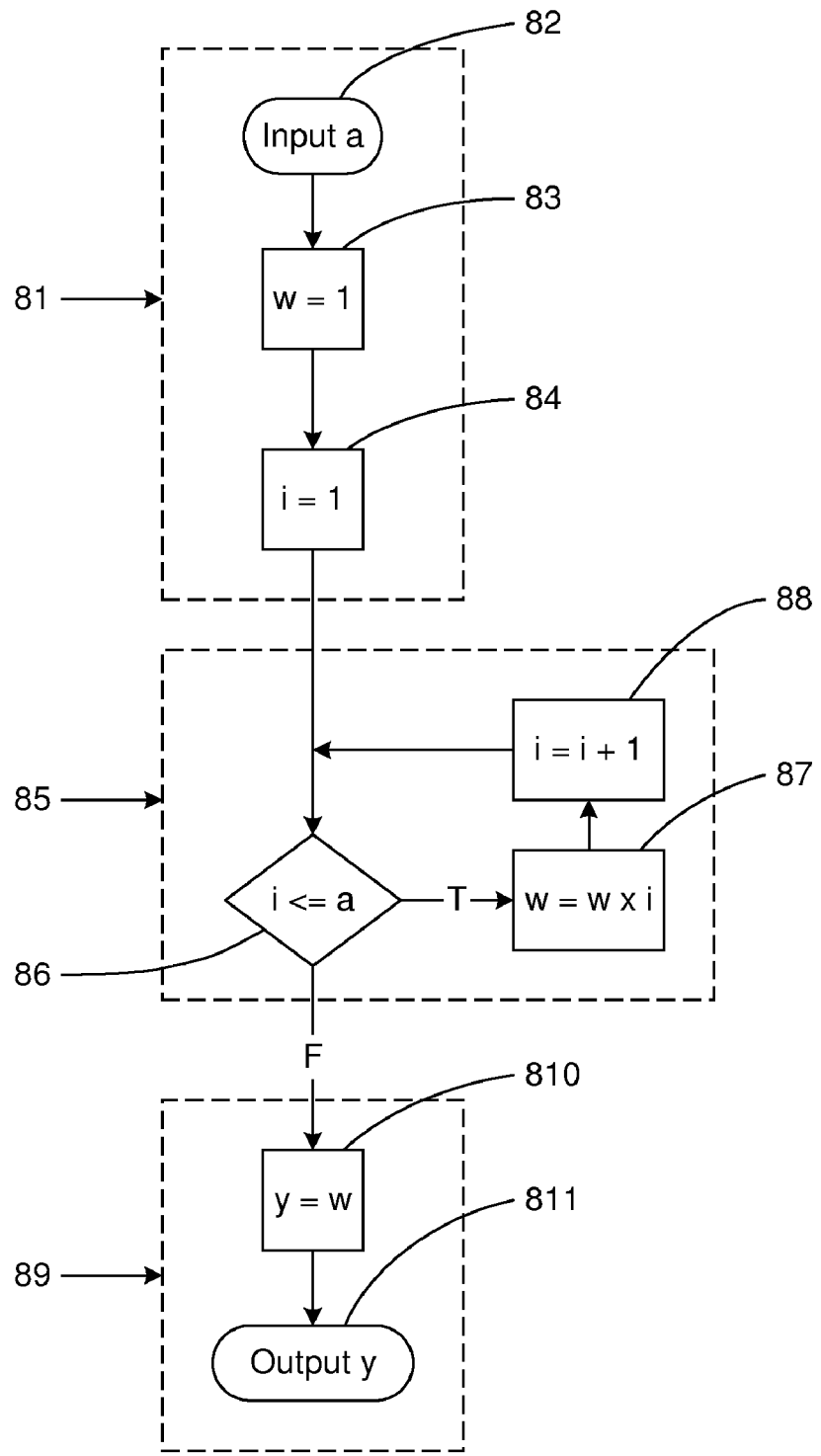
FIG. 8 is a flow diagram representing a factorial algorithm in one embodiment.

An alternate representation of the factorial algorithm is shown in FIG. 8. The input number "a" is received 82, "w" is initialized 83, and the loop counter is set to an initial value 84. Operations 82, 83 and 84 collectively form a unique grouping 81 that is separate from the looping group 85 and the group following the loop 89. These blocks of operations are delineated by the loop operation that has a specified beginning and ending condition. Operation groups may be nested. Note that the operations of group 81 are connected together in sequence. This is the convention in flowcharts since they are based on sequential languages and sequential machine architectures. In reality, as we shall see, once the operations are mapped to elements, the only sequential operations are those with data dependencies. If input data is available, the operations of elements proceed in parallel, provided any pending data output has been handled.

The loop counter test operation 86 checks whether or not to continue; if the continuation condition is met (i<=a), the multiplication is performed 87 and the loop counter is incremented 88. If the loop ending condition has been met (i>a), "w" is assigned to "y" 810 and the value is output (returned) 811.

Figure 9:
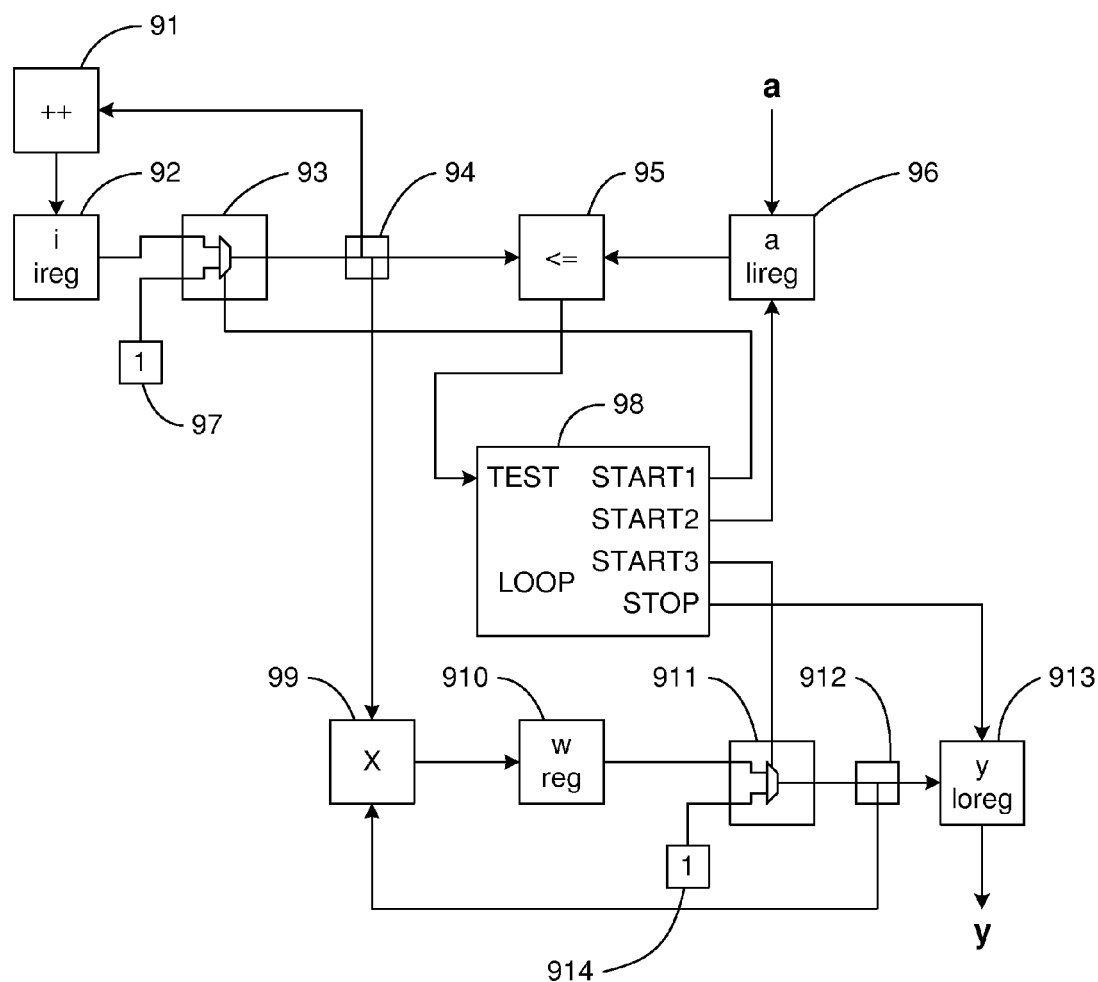
FIG. 9 is a diagram illustrating a set of data processing elements implementing the factorial algorithm of FIG. 8 in accordance with one embodiment.

The algorithm shown in the flow chart of FIG. 8 is now mapped to elements based on an available library of element operations. This process is similar to that of a software compiler generating the intermediate, generic code that is not specific to a particular processor or architecture. The result of this process is shown in FIG. 9. Each operational block shown represents one or more elements. Also note that since element-to-element connections are point-to-point, some elements (94, 912) are used to tee the data channels so that a single source may have additional destinations, increasing its fan-out.

The "a" input 82 is converted to a loop input register element (lireg) 96. Loop registers are used to control the flow of data at the input and output points of a loop. A loop input register is like a normal register with a data input and output channel, with the additional of a control input channel. The control input signifies when the input data should be sampled and loaded into the internal register, and is connected to the start loop condition. If the control input channel is true, "a" is loaded into internal registers. Subsequently, internal registers are sent out on the output data channel. Data is always output—the only conditional is the loading of the input data. The start loop condition is a Boolean value that is true on the first iteration of a loop, and false on subsequent iterations. After the last iteration of the loop, it becomes true again. The generalized sequence for the lireg (in pseudo-code) is:

| lireg |
|---|
| input a, control |
| if (control) |
|   while (!end-of-word) |
|     input b, data |
| while (!end-of-word) |
|   output data, w |

The loop counter value "i" corresponding to 88 is stored in initialized register element 92. An initialized register element has an initial parameter value (zero in this case) which is output first. From that point it is simply a delay, outputting words that are taken in. The input word mark is maintained and reflected in the output. The sequence for a ireg is:

| ireg | |
|---|---|
| | output initial_value, w |
| L1 | input a, data |
| | output data, w |
| | jump L1 |

Initial inspection may cause one to conclude that this element 92 is not necessary. Because of the feedback loop (through the increment element 91 and multiplexer 93), the path would not start up if a holding register for i was not available. The multiplexer 93 must consume data on both inputs, and that is why the ireg has an initial value of zero and outputs data before inputting it.

Constant register 97 (which corresponds to assignment 84) is used for the initialization of i. It is like a "reg", except that is has no input port connection. The constant value is held internally and is continually output. For fixed elements, this would be a hardwired value, while for programmable elements the value would be a parameter that is loaded as part of the element context or definition, or even varied by an external processor.

| creg |
|---|
| while (1) |
|   output constant, w |

The mux 93 functions as a traditional data multiplexer, and represents the closing of the feedback loop in 85. One input term is "i=1" 84, and is selected only upon entering the loop body 85, while the other term is "i=i+1" 88, and is selected until the loop is exited. The output of the mux represents "i".

Both inputs are consumed; the control input selects which input to reflect on the output; the other input is discarded. Pseudo-code for the mux operation follows:

| mux |
| --- |
| input a, control |
| input b, d1 |
| input c, d2 |
| if (control) |
|     output d1, w |
| else |
|     output d2, w |

Note that the loop comparison operator 95, the incrementer 91, and the multiplier 99 need the mux output. It is also significant to point out that the algorithm progresses only as fast as data is consumed. Therefore, a new value of "i" will not appear until the multiplier, the loop comparator, and the incrementer have all consumed the latest value. Since the mux has only one output, a tee 94 is inserted to provide additional fan-out. An alternative would be to create a mux with multiple outputs. Tee elements may also be created that have more than two outputs. The pseudo-code for a tee is as follows:

| tee |
| --- |
| input a, value |
| output value, w |
| output value, x |

The loop comparison operator 95 corresponding to 86 performs a "less-than-or-equal-to" logical computation (lte) using the current loop variable ("i") and the ending value ("a") as inputs. Pseudo-code for the comparison operation is:

| lte |
| --- |
| while (!end-of-word) |
|     input a, ending_value |
|     input b, loop_count |
|     if (first digit) |
|         r = ending_value + ~loop_count + 1 |
|     else |
|         r = ending_value + ~loop_count + carry_flag |
|     if (r zero_flag or !negative_flag) |
|         output '1', w |
|     else |
|         output '0', w |

Notice that in the lte function, computation proceeds for every input digit, while the output occurs only after all input digits have been received. In this element, two's compliment signed notation is used, and the b input is subtracted from a. The carry_flag, negative_flag, and zero_flag variables are internal flags that are set based on the operation of the ALU, similar to those in a conventional processor. The digit word position flags are used to signify the first and digit in a word.

The output of the lte element is the loop test variable: It is true during the loop iterations, and false otherwise. A special loop element 98 is used to maintain the state of the loop execution. The output of the loop comparison operation is fed into the loop element input ("test"), and two separate outputs are generated: one is set that true during the first iteration of a loop ("start"), and the other that is true on the last ("stop"). Loop iterations other than the first and last have both outputs set false. The initial condition (following a reset to the element) is for the "start" output to be true, and the "stop" output to be false. By way of example, this particular implementation has multiple "start" outputs, reducing the need for additional tee elements. It is possible to perform optimizations by merging any elements, altering their microinstruction sequences, particularly for duplicating outputs (provided sufficient input and output channels exist). While this does not impact the overall function, it may affect throughput or latency. In addition, it may also impact the resulting placement or orientation of elements within the array. The pseudo-code for the loop element is:

| loop |
| --- |
| if (reset) |
|     flag = 1 |
|     output flag, w    // start1 |
|     output flag, x    // start2 |
|     output flag, y    // start3 |
| while (!end-of-word) |
|     input a, test |
| if (test > 0) |
|     flag = 0 |
| else |
|     flag = 1 |
| output flag, z    // stop |

Multiplier element 99 performs integer multiplication of two inputs. If the first input has n digits, and the second has m digits, the result will have n+m digits. In the factorial example, the previous product is multiplied by loop variable "i". The pseudo-code for the multiplier element is:

| mul |
| --- |
| while (!end-of-word) |
|     input a, n |
| while (!end-of-word) |
|     input b, m |
|     [product, product_remainder] = n * m |
|     output product, w |
| while (!end-of-word) |
|     output product_remainder, w |

The notation used for the actual multiply with product and product_remainder as a result is an attempt to illustrate the different word sizes for full precision multiplication.

Register 910 holds the working product value for subsequent iterations. The functionality of this element is very similar to that of 92. The register size must be large enough to hold the maximum value, which may be attained by cascading multiple elements. The sequence for a reg is:

| reg |
| --- |
| input a, data |
| output data, w |

Constant 914 is identical in function to 97, and multiplexer 911 is the same as 93. Tee 912 is identical to that of 94.

The loop output register (loreg) 913 is similar in function to lireg 96. The lireg always outputs held data, but only updates it's internal register when selected; the loreg always accepts input data, but only provides output data when selected. The lireg would be generally used on loops inputs, while the loreg would generally be used on loop outputs. Pseudo-code for the loreg is shown below:

```
                    loreg
    input a, control      // stop loop condition
    while (!end-of-word)
        input b, data
        if (control != 0)
            output data, w    // y output
```

The loreg control input is connected to the loop element stop signal, therefore "y" data will only be available after all loop iterations have completed.

Figure 10:
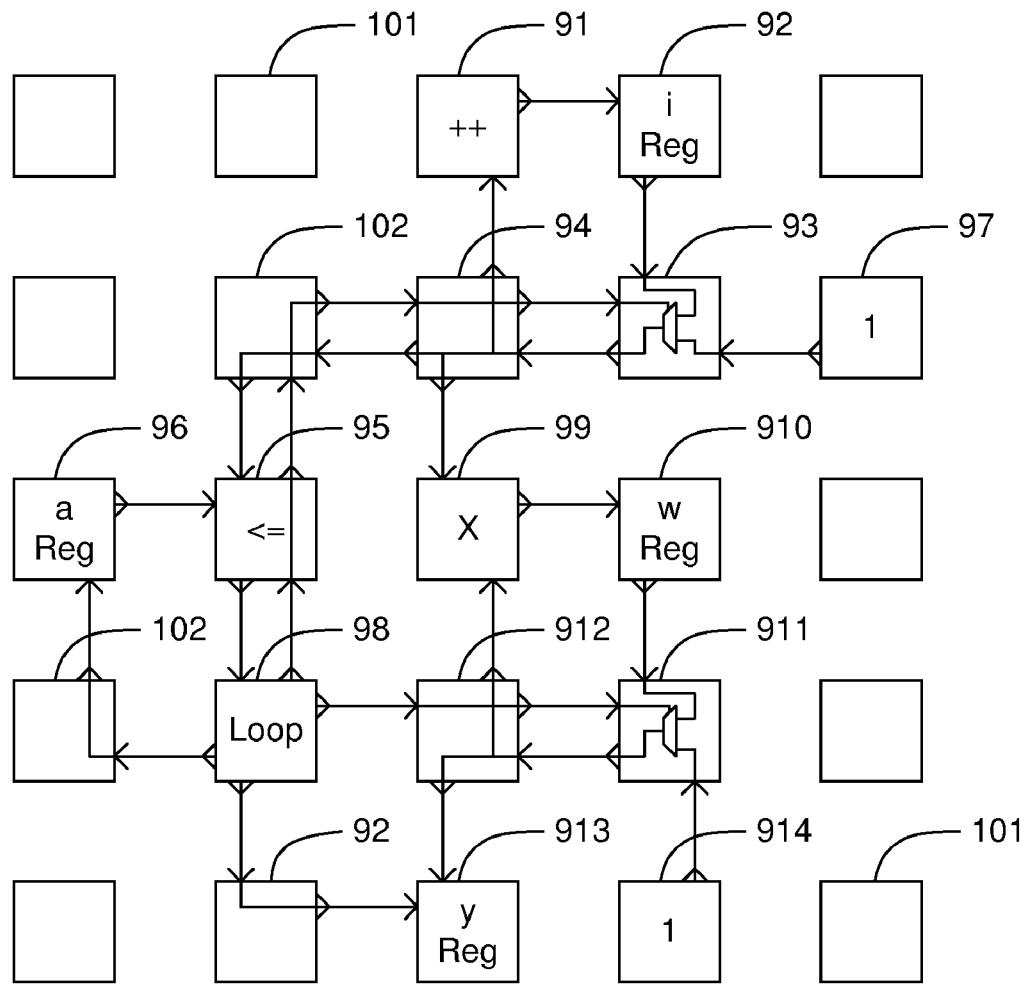
FIG. 10 is a diagram illustrating the data processing elements of FIG. 9 in a row/column array in accordance with one embodiment.

FIG. 10 is a depiction of the elements of FIG. 9 mapped into an array of identical elements. Unused elements 101 occupy positions that are not needed for the particular mapping of the algorithm being performed. Some elements are unused in terms of element operations, but are used to provide interconnect, such as element 102. Other elements that perform functions may have spare input or output channels that are utilized to provide inter-element routing, bypassing the actual element, such as 95.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented in various ways. To clearly illustrate this variability of the system's topology, the illustrative components, blocks, modules, circuits, and steps have been described above generally in terms of their functionality. Whether such functionality is implemented in the particular functional blocks specifically described above depends upon the particular application and design constraints imposed on the overall system and corresponding design choices. Those of skill in the art may implement the described functionality in varying ways for each particular application, but such implementation decisions should not be interpreted as causing a departure from the scope of the present invention.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
   a plurality of data processing elements, wherein each of the data processing elements operates asynchronously with respect to local periodic clock signals and independently of control signals used by the other data processing elements;
   one or more interconnects coupling the data processing elements together in an array;
   wherein the interconnects are configured to convey data between each pair of the data processing elements in a manner which is asynchronous with respect to timing reference signals and independent of control signals used by other pairs of the data processing elements.

2. The system of claim 1, wherein one or more of the interconnects are configured to convey variable precision data between the data processing elements.

3. The system of claim 1, wherein one or more of the data processing elements are configured to operate in a locally synchronous and globally asynchronous fashion.

4. The system of claim 1, wherein each data processing element is programmable to bypass data received from a first neighboring data processing element to a second neighboring data processing element without operating on the data.

5. The system of claim 1, wherein each data processing element is programmable to receive data from a first neighboring data processing element, operate on the data, and forward a result of the operation to a second neighboring data processing element.

6. The system of claim 1, wherein one or more of the data processing elements is configured to process digit-serial data.

7. The system of claim 1, wherein one or more of the data processing elements is configured to process digit-serial data which includes tags to identify positions of bits in corresponding data words.

8. The system of claim 7, wherein one or more of the data processing elements is configured to process digit-serial data in which each digit includes a first tag indicating whether the digit is a first digit in the corresponding data word and a second tag indicating whether the digit is a last digit in the corresponding data word.

9. The system of claim 1, wherein each data processing element is configured to perform a single predetermined operation on any data received by the data processing element.

10. The system of claim 1, wherein each of the data processing elements is configured to perform one of a plurality of selectable operations on received data.

11. The system of claim 1, wherein each data processing element is programmable to alternately receive data from two or more neighboring data processing elements and is programmable to provide output data to two or more neighboring data processing elements.

12. The system of claim 1, further comprising a non-variable-precision system bus coupled to one or more of the data processing elements and configured to enable communication of data between the one or more data processing elements and a peripheral device.

13. The system of claim 12, wherein the peripheral device comprises an external memory.

14. The system of claim 1, further comprising a command interface coupled to the data processing elements and configured to enable communication of commands to the data processing elements.

15. The system of claim 1, further comprising a status interface coupled to the data processing elements and configured to enable communication of status information from the data processing elements to a control unit.

16. A system comprising:
a plurality of data processing elements, wherein each of the data processing elements operates asynchronously with respect to local periodic clock signals and independently of control signals used by the other data processing elements;
one or more interconnects coupling the data processing elements together in an array;
wherein one or more of the interconnects are configured to convey variable precision data between one or more pairs of the data processing elements in a manner which is independent of control signals used by other pairs of the data processing elements.

17. The system of claim 16, wherein one or more of the data processing elements comprise data processing elements that operate asynchronously with respect to timing reference signals used by other data processing elements.

18. The system of claim 16, wherein one or more of the data processing elements are configured to operate in a locally synchronous and globally asynchronous fashion.

19. The system of claim 16, wherein each data processing element is programmable to bypass data received from a first neighboring data processing element to a second neighboring data processing element without operating on the data.

20. The system of claim 16, wherein each data processing element is programmable to receive data from a first neighboring data processing element, operate on the data, and forward a result of the operation to a second neighboring data processing element.

21. The system of claim 16, wherein one or more of the data processing elements is configured to process digit-serial data.

22. The system of claim 16, wherein one or more of the data processing elements is configured to process digit-serial data which includes tags to identify positions of bits in corresponding data words.

23. The system of claim 22, wherein one or more of the data processing elements is configured to process digit-serial data in which each digit includes a first tag indicating whether the digit is a first digit in the corresponding data word and a second tag indicating whether the digit is a last digit in the corresponding data word.

24. The system of claim 16, wherein each data processing element is configured to perform a single predetermined operation on any data received by the data processing element.

25. The system of claim 16, wherein each of the data processing elements is configured to perform one of a plurality of selectable operations on received data.

26. The system of claim 16, wherein each data processing element is programmable to alternately receive data from two or more neighboring data processing elements and is programmable to provide output data to two or more neighboring data processing elements.

27. The system of claim 16, further comprising a non-variable-precision system bus coupled to one or more of the data processing elements and configured to enable communication of data between the one or more data processing elements and a peripheral device.

28. The system of claim 27, wherein the peripheral device comprises an external memory.

29. The system of claim 16, further comprising a command interface coupled to the data processing elements and configured to enable communication of commands to the data processing elements.

30. The system of claim 16, further comprising a status interface coupled to the data processing elements and configured to enable communication of status information from the data processing elements to a control unit.

* * * * *